United States Patent
Wang et al.

(10) Patent No.: US 8,823,180 B2
(45) Date of Patent: Sep. 2, 2014

(54) PACKAGE ON PACKAGE DEVICES AND METHODS OF PACKAGING SEMICONDUCTOR DIES

(75) Inventors: Tsung-Ding Wang, Tainan (TW);
Ming-Chung Sung, Taichung (TW);
Jiun Yi Wu, Zhongli (TW);
Chien-Hsiun Lee, Chu-tung Town (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 61 days.

(21) Appl. No.: 13/493,862

(22) Filed: Jun. 11, 2012

(65) Prior Publication Data

US 2013/0168856 A1  Jul. 4, 2013

Related U.S. Application Data

(60) Provisional application No. 61/580,908, filed on Dec. 28, 2011.

(51) Int. Cl.
*H01L 23/48* (2006.01)
*H01L 23/52* (2006.01)
*H01L 29/40* (2006.01)

(52) U.S. Cl.
USPC ........... 257/775; 257/779; 257/780; 257/773; 257/737; 438/107

(58) Field of Classification Search
USPC ........... 257/737, 773, 775, 779, 780; 438/107
See application file for complete search history.

(56) References Cited

U.S. PATENT DOCUMENTS

| | | | | |
|---|---|---|---|---|
| 5,889,326 A | * | 3/1999 | Tanaka | 257/737 |
| 6,062,459 A | | 5/2000 | Sabyeying | |
| 7,246,735 B2 | | 7/2007 | Liu et al. | |
| 7,372,151 B1 | * | 5/2008 | Fan et al. | 257/738 |
| 7,405,478 B2 | * | 7/2008 | Ishikawa et al. | 257/737 |
| 7,614,538 B2 | | 11/2009 | Gillotti et al. | |
| 8,525,318 B1 | * | 9/2013 | Kim et al. | 257/686 |
| 2002/0011674 A1 | * | 1/2002 | Efland et al. | 257/762 |
| 2002/0117330 A1 | | 8/2002 | Eldridge et al. | |
| 2003/0173684 A1 | | 9/2003 | Joshi et al. | |
| 2004/0145051 A1 | * | 7/2004 | Klein et al. | 257/734 |
| 2005/0087883 A1 | * | 4/2005 | Hwee et al. | 257/778 |
| 2005/0199677 A1 | | 9/2005 | Sadler et al. | |
| 2006/0286828 A1 | | 12/2006 | Khandros | |

(Continued)

OTHER PUBLICATIONS

McCormick, H., et al., "Assembly and Reliability Assessment of Fine Pitch TMV Package on Package (PoP) Components," Proceedings of the SMTA International Conference, San Diego, CA Oct. 4-8, 2009, 8 pages.

(Continued)

*Primary Examiner* — Karen Kusumakar
(74) *Attorney, Agent, or Firm* — Slater and Matsil, L.L.P.

(57) ABSTRACT

Package on package (PoP) devices and methods of packaging semiconductor dies are disclosed. A PoP device includes a bottom packaged die having solder balls disposed on the top surface thereof and a top packaged die having metal stud bumps disposed on a bottom surface thereof. The metal stud bumps include a bump region and a tail region coupled to the bump region. Each metal stud bump on the top packaged die is coupled to one of the solder balls on the bottom packaged die.

18 Claims, 10 Drawing Sheets

(56) References Cited

U.S. PATENT DOCUMENTS

| | | | |
|---|---|---|---|
| 2008/0073769 A1* | 3/2008 | Wu et al. | 257/686 |
| 2008/0258289 A1* | 10/2008 | Pendse et al. | 257/690 |
| 2010/0171205 A1* | 7/2010 | Chen et al. | 257/686 |
| 2010/0224974 A1 | 9/2010 | Shim et al. | |

OTHER PUBLICATIONS

Smith, L., "Package-on-package: thinner, faster, denser," Electro IQ® Technology Insights for Electronics Manufacturing, http://www.electroiq.com/articles/sst/print/volume-54/issue-7/features/pop/package-on-package-thinner-faster-denser.html, Solid State Technology, vol. 54, Issue 7, Jul. 12, 2011, pp. 1-6.

* cited by examiner

PACKAGE ON PACKAGE DEVICES AND METHODS OF PACKAGING SEMICONDUCTOR DIES

CROSS-REFERENCE TO RELATED APPLICATIONS

This application claims the benefit of U.S. Provisional Application No. 61/580,908 filed on Dec. 28, 2011, entitled, "Package on Package Joint Structures and Methods of Manufacturing Same," which is incorporated herein by reference in its entirety. This application also relates to the following co-pending and commonly assigned U.S. patent application: Ser. No. 13/483,734, filed on May 30, 2012, entitled, "Package on Package Devices and Methods of Packaging Semiconductor Dies," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones. While PoP technology has allowed for a lower package profile, the total thickness reduction is currently limited by the solder ball joint height between the top package and bottom package.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 10:
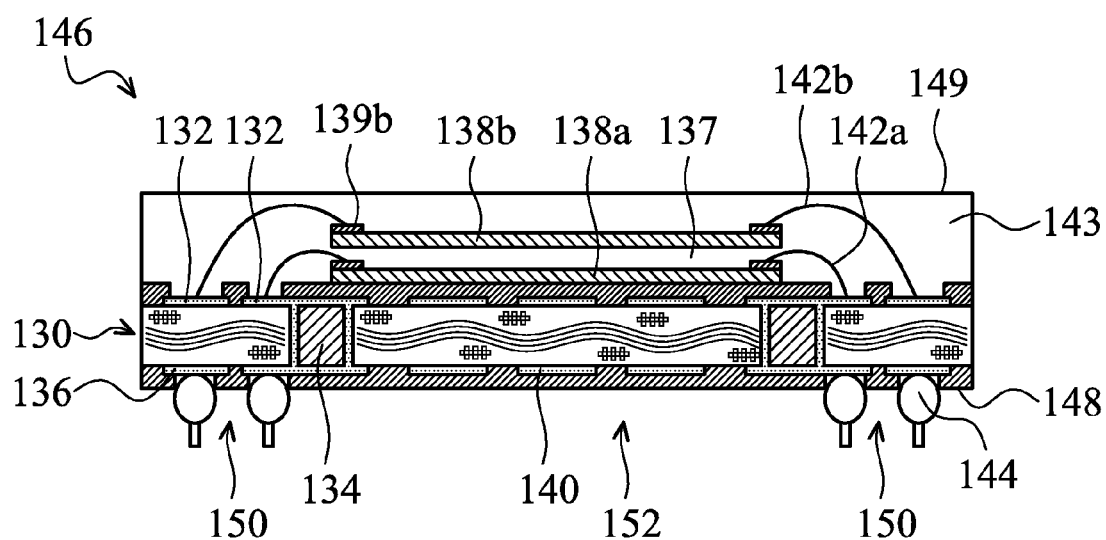
Figure 15:
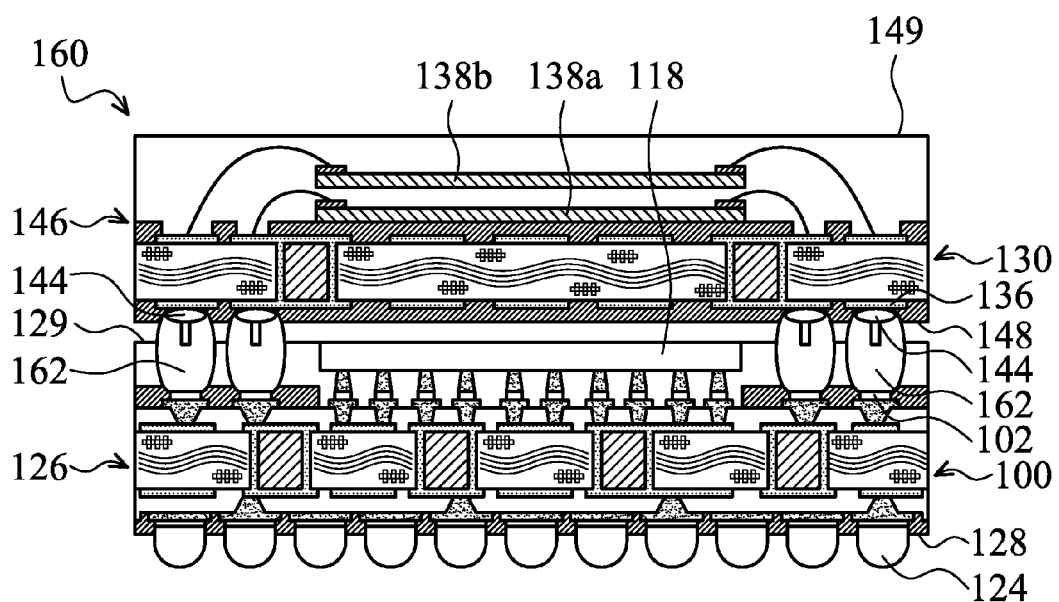
FIGS. 15 through 17 show cross-sectional views of PoP devices packaged in accordance with embodiments.
Figure 16:
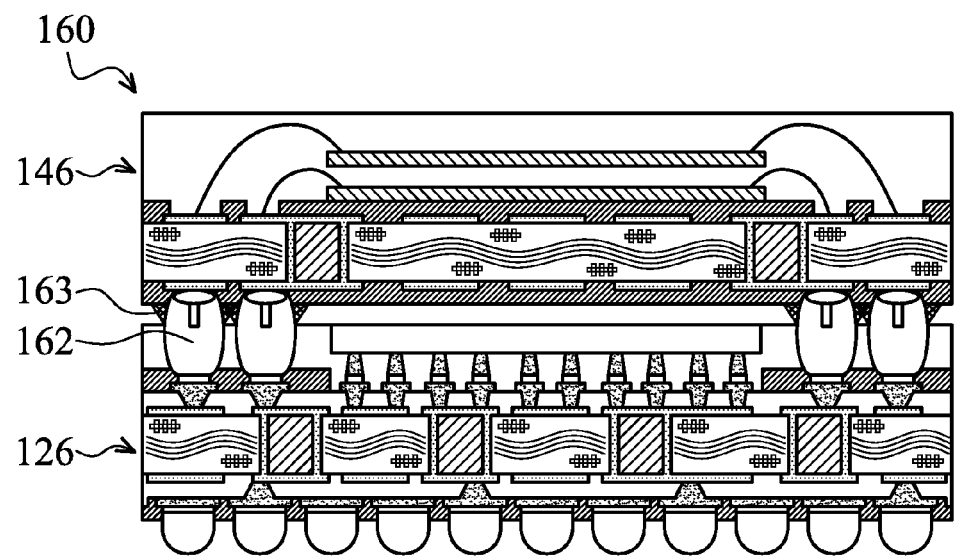
Figure 17:
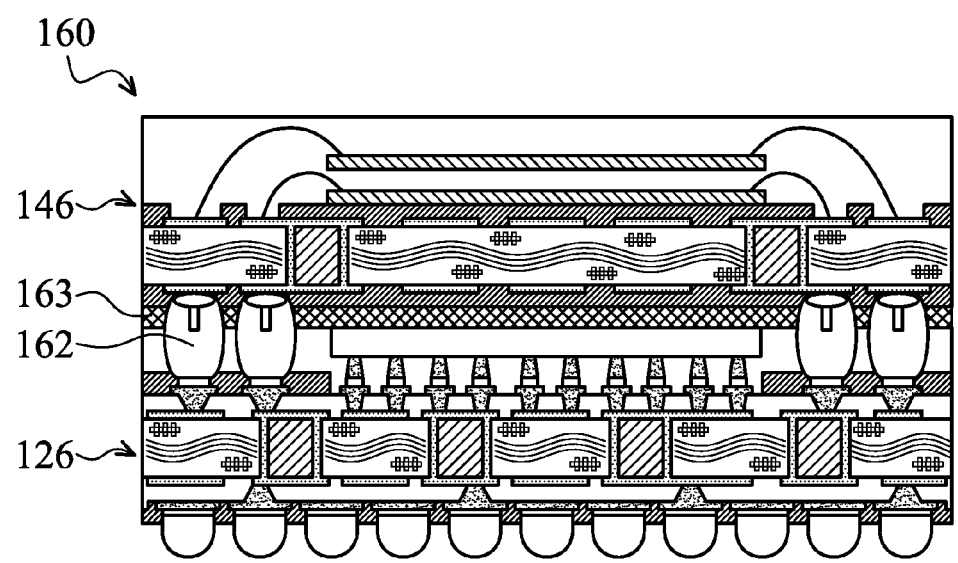

Embodiments of the present disclosure are related to packaging of semiconductor devices. Novel packaging structures and methods of packaging multiple semiconductor devices in PoP packages will be described herein. A first die 118 is packaged to form a first packaged die 126, shown in FIG. 6, and one or more second dies 138*a* and 138*b* are packaged to form a second packaged die 146, as shown in FIG. 10. The second packaged die 146 is packaged with the first packaged die 126, forming a PoP device 160, as shown in FIGS. 15, 16 and 17, to be described further herein. Solder balls 112 on the first packaged die 126 and metal stud bumps 144 on the second packaged die 146 are jointed to form a low profile of solder around the metal stud bump 144 structure. Note that for simplification, not all element numbers are included in each subsequent drawing; rather, the element numbers most pertinent to the description of each drawing are included in each of the drawings.

Figure 1:
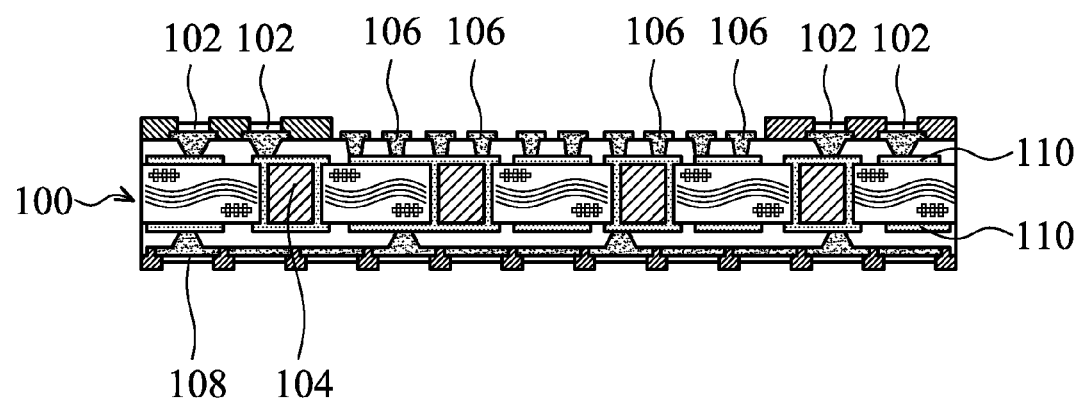
FIGS. 1 through 6 show cross-sectional views of a method of packaging a first die at various stages in accordance with an embodiment of the present disclosure.

FIGS. 1 through 6 show cross-sectional views of a method of packaging the first die 118 and forming the solder balls 112 on a top surface of the first packaged die 126 at various stages in accordance with an embodiment of the present disclosure. Referring first to FIG. 1, a first substrate 100 is provided. Only one first substrate 100 is shown in the drawings; however, several first substrates 100 are processed on a workpiece comprising a plurality of first substrates 100, and the workpiece is later singulated, after packaging first dies 118 on the first substrates 100.

The first substrate 100 comprises an interposer comprised of an insulating material or glass in some embodiments. In other embodiments, the first substrate 100 comprises a semiconductive material such as a semiconductor wafer. The first substrate 100 may include electronic components and elements formed thereon in some embodiments, or alternatively, the first substrate 100 may be free of electronic components and elements. The first substrate 100 may comprise a bare substrate in some embodiments, for example.

Bond pads 102 are formed on the top surface of the first substrate 100 in a perimeter region that is disposed proximate edges of the first substrate 100, as can be seen in the cross-sectional view of FIG. 1. Bond pads and/or traces 106 are formed on the top surface of the first substrate 100 in a central region disposed within the perimeter region of the first substrate 100. Bond pads 108 are formed on the bottom surface of the first substrate 100. The bond pads 108 may be arranged in an array of rows and columns or other patterns on the bottom surface of the first substrate 100. The bond pads 108 may fully populate the bottom surface or may be arranged in various patterns, such as patterns used in ball grid array (BGA) or land grid array (LGA) package devices, as examples. The bond pads 102, bond pads and/or traces 106, and bond pads 108 comprise conductive materials such as Al, Cu, Au, alloys thereof, other materials, or combinations and/or multiple layers thereof, as examples. Alternatively, the bond pads 102, bond pads and/or traces 106, and bond pads 108 may comprise other materials.

The first substrate 100 includes a plurality of through-substrate vias (TSVs) 104 formed therein in some embodiments. The TSVs 104 comprise conductive or semiconductive material that extends completely through the first substrate 100 may optionally be lined with an insulating material. The TSVs 104 provide vertical electrical connections (e.g., y-axis connections in FIG. 1) from a bottom surface to a top surface of the first substrate 100.

The first substrate 100 includes wiring 110 formed within one or more insulating material layers. The wiring 110 provides horizontal electrical connections (e.g., x-axis connections in the view shown in FIG. 1) in some embodiments, for example. The wiring 110 may include fan-out regions that include traces of conductive material for expanding the footprint of a first die (not shown in FIG. 1: see first die 118 in FIG. 4) to a footprint of the bottom side of the first substrate 100, e.g., of the bond pads 108. The wiring 110 of the first substrate 100 may include one or more redistribution layers (RDLs). The RDLs may comprise one or more insulating layers and wiring layers. The RDLs may include inter-level dielectrics (ILDs) with wiring in metallization layers disposed or formed therein. The wiring 110 may comprise one or more vias and/or conductive lines, for example. The wiring 110 and the TSVs 104 may be formed using one or more subtractive etch processes, single damascene techniques, and/or dual damascene techniques, as examples. One or more carrier wafers, not shown, may be used to form the wiring 110 and/or the TSVs 104. A portion of the wiring 110 may reside on the top and bottom surfaces of the first substrate 100; e.g., portions of the wiring 110 of the first substrate 100 may comprise bond pads 102, bond pads and/or traces 106, and bond pads 108 that are coupleable to other elements. Alternatively, the bond pads 102, bond pads and/or traces 106, and bond pads 108 may be formed separately and attached to portions of the wiring 110, in other embodiments.

Figure 2:
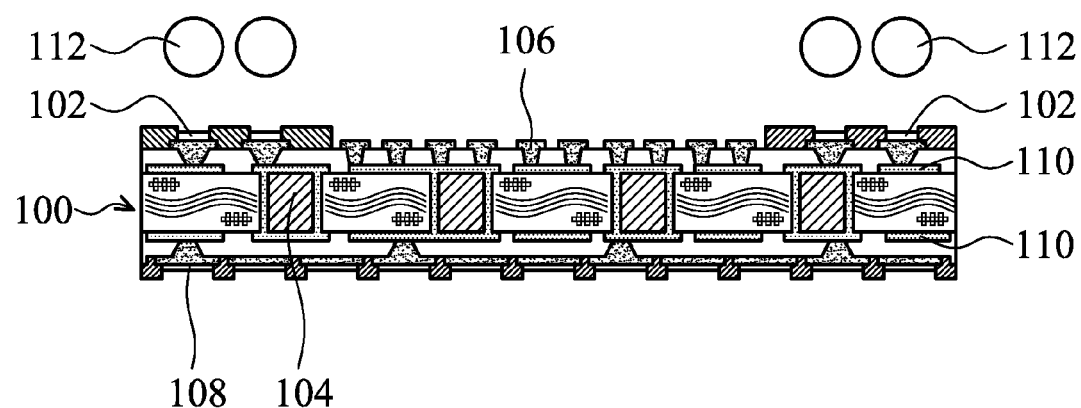
Figure 3:
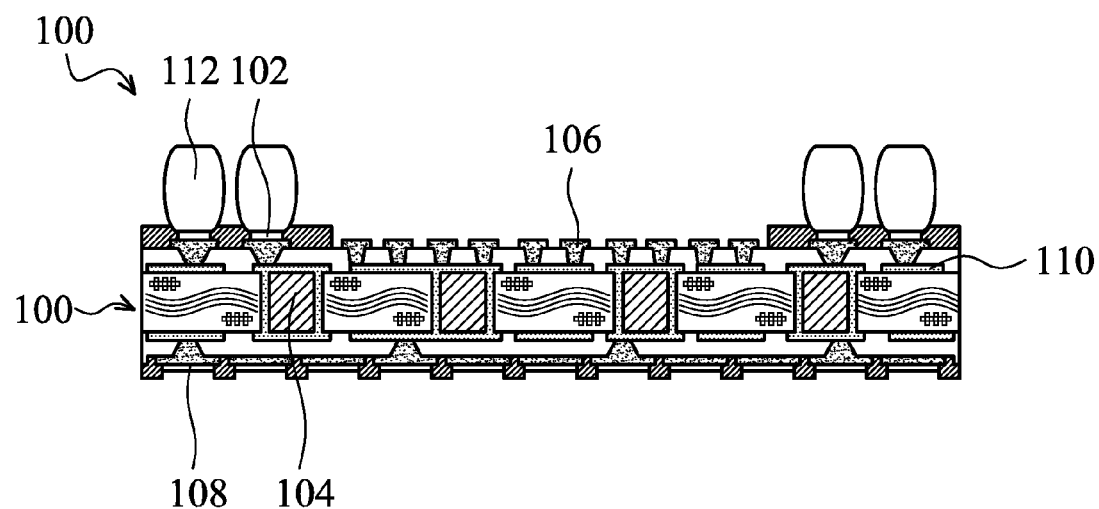

In accordance with embodiments of the present disclosure, a plurality of solder balls 112 is attached to the bond pads 102 on the top surface of the substrate 100, as shown in FIG. 2. The solder balls 112 are wettable to join to metal stud bumps 144 that are formed on a second packaged die 146 (see FIG. 10). The solder balls 112 are formed using a top ball mount process in some embodiments. After the solder balls 112 are formed on the bond pads 102, the first substrate 100 is subjected to a solder flow process by heating the substrate 100 to a temperature above the melting point of the solder material of the solder balls 112, causing the solder material become liquid and to flow, resulting in the attachment, both electrically and mechanically, of the solder balls 112 to the bond pads 102, as shown in FIG. 3. The solder balls 112 may be oval or circular in a side view after the flow process.

Figure 4:
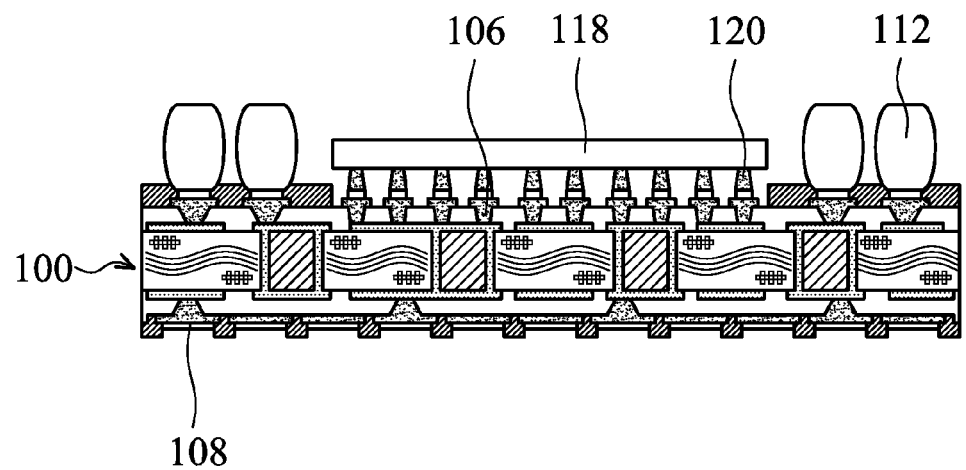

Next, a first die 118 is provided and is attached to the first substrate 100, as shown in FIG. 4. The first die 118 comprises an integrated circuit or chip that will be packaged with a second die 138a and optionally also a third die 138b in a single PoP device 160 (see FIG. 15). The first die 118 may include a workpiece that includes a semiconductor substrate comprising silicon or other semiconductor materials and may be covered by an insulating layer, for example. The first die 118 may include one or more components and/or circuits formed in and/or over the workpiece, not shown. The first die 118 may include conductive layers and/or semiconductor elements, e.g., transistors, diodes, capacitors, etc., also not shown. The first die 118 may comprise logic circuitry, memory devices, or other types of circuits, as examples. The first die 118 may include a plurality of contacts (not shown) formed on a bottom surface thereof.

A plurality of solder bumps 120 is formed on the bottom surface of the first die 118, e.g., on the plurality of contacts on the bottom surface of the first die 118. The solder bumps 120 may comprise microbumps or solder balls, as examples. The solder bumps on the first die 118 are then attached to the bond pads and/or traces 106 on the top surface of the first substrate 100, as shown in FIG. 4. A solder reflow process is used to reflow the solder of the solder bumps 120 and attach the first die 118 to the first substrate 100, electrically and mechanically attaching the solder bumps 120 to the bond pads or traces 106 of the first substrate 100, for example. The solder bumps 120 may alternatively be attached to the first substrate 100 using other methods.

In some embodiments, the first die 118 is attached to the first substrate 100 using a flip-chip bond-on-trace (BOT) attachment technique. The bond pads and/or traces 106 may include bump-on-trace patterns that are used to attach a die to the substrate in an embodiment, wherein the first die 118 is packaged using a BOT packaging technique. Alternatively, the patterns of the bond pads and/or traces 106 may comprise patterns typically used for solder balls, in other embodiments. Other flip-chip attachment techniques and other types of bond pads 106 may also be used to attach the first die 118 to the first substrate 118.

The first substrate 100 and the first die 118 are then subjected to a cleaning process, in some embodiments. The cleaning process may comprise a plasma process that is adapted to clean exposed surfaces of the first substrate 100 and the components formed thereon. The cleaning process improves a flow of a molding compound 122 (see FIG. 5) during its application, and improves a subsequent solder flow step.

Figure 5:
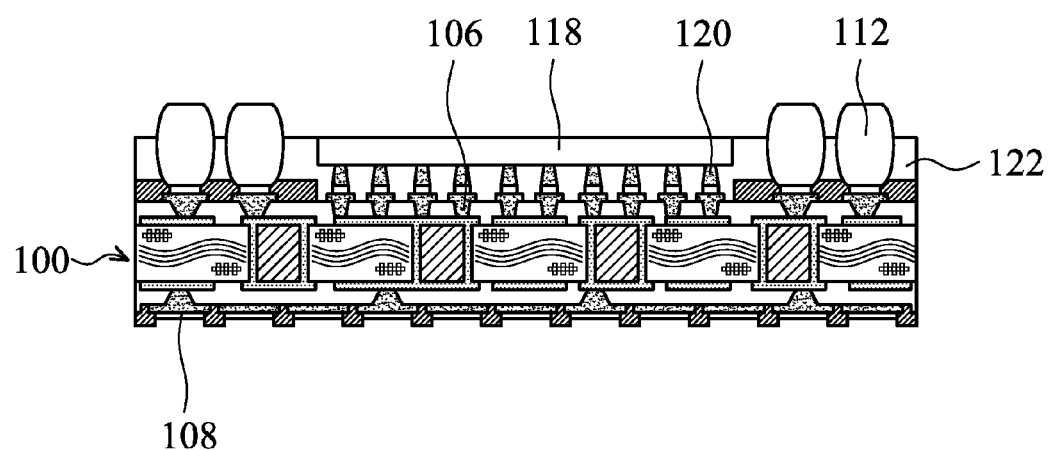

A molding compound 122 is then applied over the first substrate 100, as shown in FIG. 5. The molding compound 122 flows under the first die 118, between the first substrate 100 and the first die 118. The molding compound 122 is applied so that the molding compound 122 is formed between the solder balls 112, leaving the top surfaces of the solder balls 112 exposed. The molding compound 122 may be applied using a transfer mold method, a spray-on method, or using a dispensing needle along one or more edges of the first die 118, for example. In a transfer mold method, the molding compound 122 is formed by providing a solid ingot of the molding compound 122 material, heating the ingot until it becomes a liquid, and transferring the liquid molding compound 122 to a mold case (not shown) that includes the first substrate 100 the first die 118. A vacuum system (also not shown) may be used to assist in the flow of the liquid molding compound 122 material during its application, for example.

In some embodiments, the molding compound 122 may be formed over the top surfaces of the solder balls 112, and a top portion of the molding compound 122 is then removed using an etch process. In other embodiments, the molding compound 122 may be formed to about a top surface of the solder balls 112, and due to shrinkage of the molding compound 122 after a curing or drying process, the molding compound 122 shrinks to a level below the top surface of the solder balls. The molding compound 122 may not be formed over the first die 118 in some embodiments, for improved thermal performance.

The molding compound 122 may be formed using a molded underfill (MUF) process to expose the first die 118 and the solder balls 112, for example, for improved warpage control. The MUF process comprises forming a molding compound that also functions as an underfill material, which reduces costs. A separate application of an underfill material is not required in this embodiment, for example. Alternatively, a separate underfill material (not shown) may be applied under the first die 118, and the molding compound 122 is then formed around the first die 118 and between the solder balls 112.

The molding compound 122 comprises epoxy or a polymer in some embodiments, as examples. Alternatively, other methods may also be used to form the molding compound 122, and the molding compound 122 may comprise other materials. The molding compound 122 comprises an insulating material that protects the connections of the solder bumps 120, for example. The molding compound 122 is also referred to herein as a first molding compound.

Figure 6:
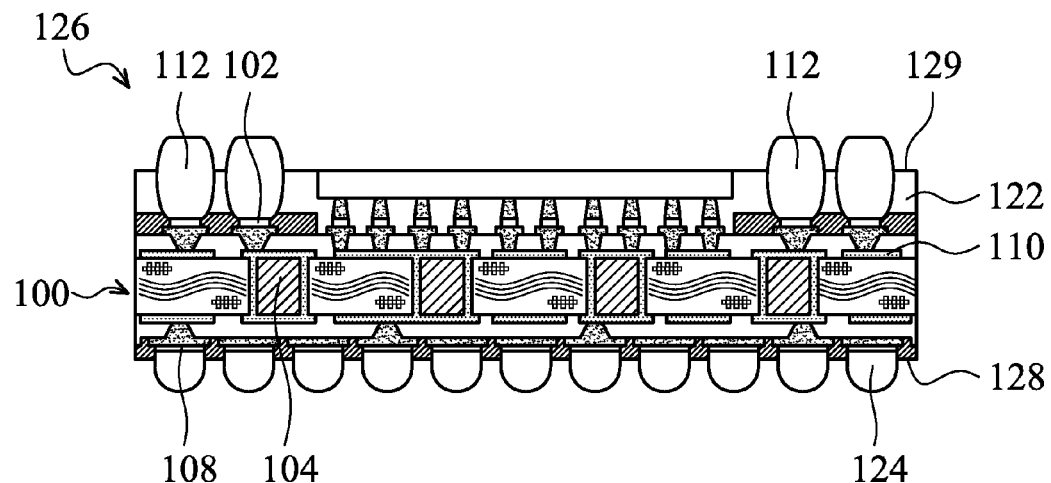

A plurality of solder balls 124 is then formed on the bottom surface of the first substrate 100, as shown in FIG. 6. The solder balls 124 are attached to the bond pads 108 on the bottom surface of the first substrate 100. The solder balls 124 may be formed using a ball mount process followed by a solder reflow process as described for solder balls 112, for example. The solder balls 124 may alternatively be formed using other methods. The solder balls 124 may be smaller than the solder balls 112 on the top surface of the first substrate 100, as illustrated. Alternatively, the solder balls 124 may comprise substantially the same size as solder balls 112, or may be larger than solder balls 112. The size of the solder balls 124 may vary as a function of the size of the bond pads 102 and 108 and an amount of other materials surrounding the bond pads 102 and 108, for example.

The first substrate 100 is then singulated from other first substrates 100 on the workpiece, forming a first packaged die 126, also shown in FIG. 6. The first packaged die 126 is also referred to herein as a bottom packaged die. The bottom packaged die 126 comprises a plurality of bond pads 102 proximate the top surface 129 thereof, and includes a plurality of solder balls 124 formed on bond pads 108 proximate the bottom surface 128 thereof. Each of the plurality of solder balls 112 is bonded to a bond pad 102 proximate the top surface 129 of the bottom packaged die 126. Final tests are then performed on the first or bottom packaged die 126.

Figure 7:
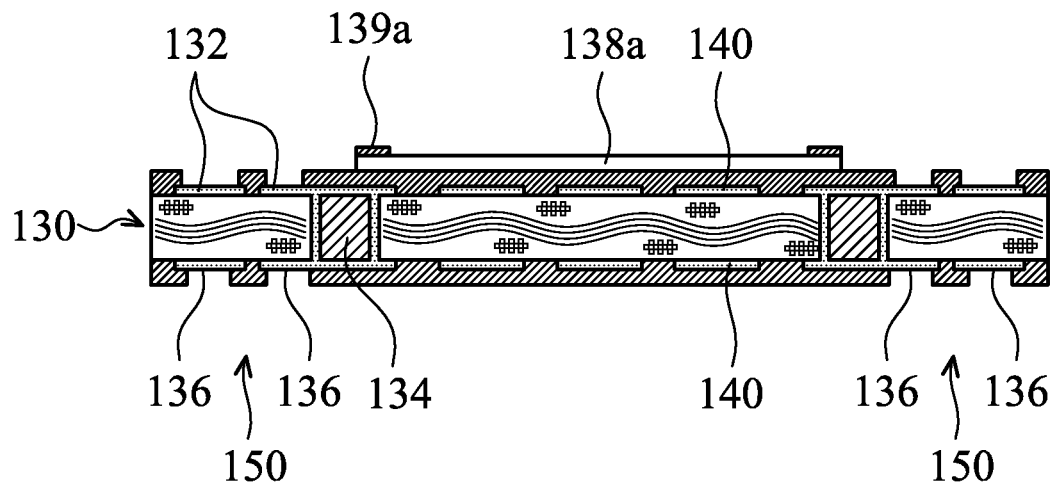
FIGS. 7 through 10 show cross-sectional views of a method of packaging at least one second die at various stages in accordance with an embodiment.

FIGS. 7 through 10 show cross-sectional views of a method of packaging at least one second die 138a at various stages in accordance with an embodiment. A second substrate 130 is provided, as shown in FIG. 7, which may comprise a substrate similar to the first substrate 100 described herein and which may comprise similar materials and components as the first substrate 100. The second substrate 130 may include TSVs 134 and wiring 140 similar to the TSVs 104 and wiring 110, respectively, that were described herein for the first substrate 100. The second substrate 130 includes contact pads 132 on the top surface in a perimeter region and contacts 136 on the bottom surface in a perimeter region 150. The contact pads 132 and contacts 136 may comprise similar materials and may be formed using similar methods as described for the bond pads 102, bond pads or traces 106, and bond pads 108 of the first substrate 100, for example. In some embodiments, the second substrate 130 may not include an RDL in the wiring 140. All or some of the x-axis or horizontal electrical connections may be made using wire bonds 142a and/or 142b (see FIG. 9), in these embodiments.

A second die 138a is provided, as shown in FIG. 7. The second die 138a may comprise a die similar to that described herein for the first die 118, for example. At least one second die 138a is attached to the top surface of the second substrate 130. The second die 138a includes a plurality of contacts 139a disposed on a top surface thereof in a perimeter region. The second die 138a is attached to the top surface of the second substrate 130 using a glue or adhesive, not shown.

Figure 8:
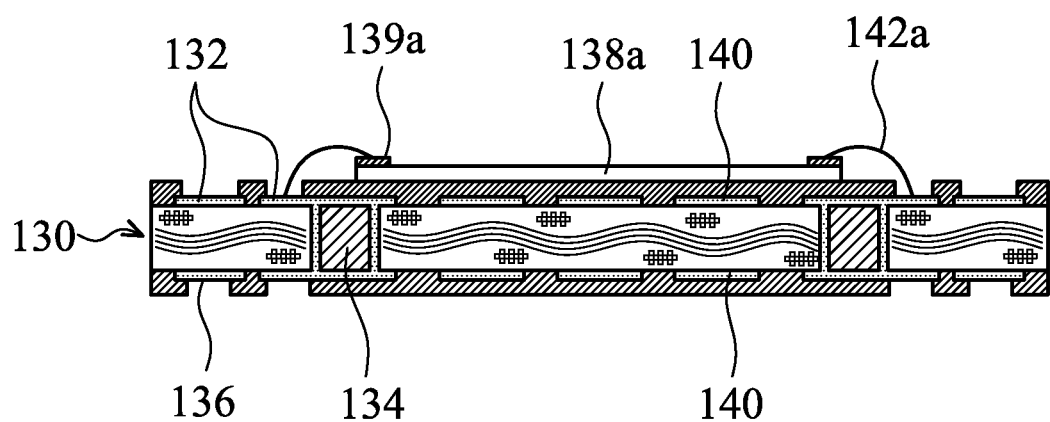

The second die 138a is then electrically connected to the second substrate 130 using wire bonds 142a along two or more edges of the second die 138a, as shown in FIG. 8. The second die 138a may be wire-bonded along all four edges to the second substrate 130 in an embodiment, for example. Coupling the second die 138a to the top surface of the second substrate 130 comprises wire-bonding contacts 139a on a top surface of the second die 138a to contact pads 132 on the top surface of the second substrate 130 using the wire bonds 142a, in an embodiment.

Figure 9:
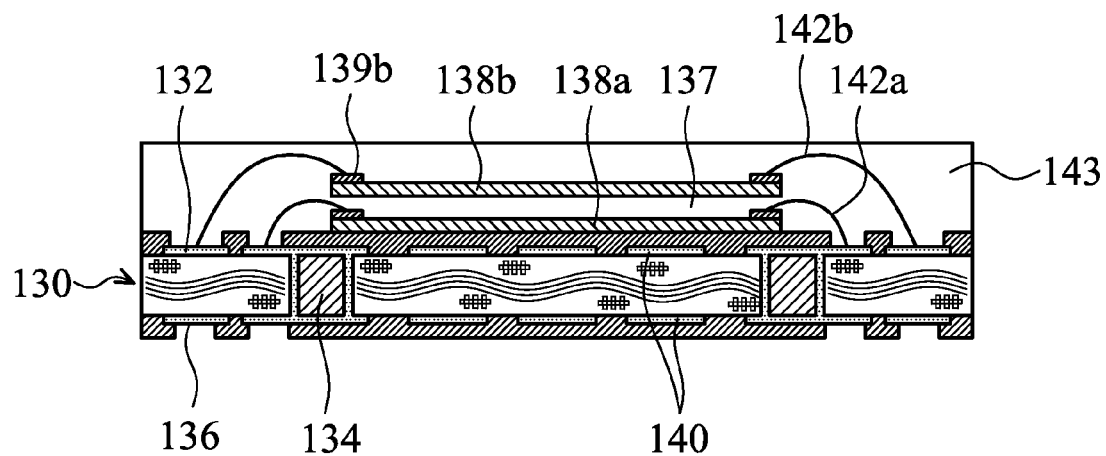

In some embodiments, one second die 138a is coupled to the second substrate 130, and then a molding compound (such as molding compound 143 shown in FIG. 9) is formed over the second die 138a and top surface of the second substrate 130, not shown in the drawings. In other embodiments, two second dies 138a and 138b are coupled over the second substrate 130, as shown in FIG. 9. A plurality of second dies 138a and 138b are stacked vertically above the second substrate 130 in some embodiments, for example.

The second die 138b is also referred to herein as a third die. The third die 138b is coupled over the second die 138a, e.g., attached to the top surface of the second die 138a using a glue or adhesive 137, as shown in FIG. 9. Contacts 139b on a top surface of the third die 138b are wire-bonded using wire bonds 142b to contact pads 132 on the top surface of the second substrate 130, also shown in FIG. 9. The third die 138b is wire-bonded to the second substrate 130 similar to the wire-bonding of the second die 138a to the second substrate 130 described herein, for example. Two or more rows of contact pads 132 may be formed on the top surface of the second substrate 130. The inner-most row of contact pads 132 is wire-bonded to the second die 138a, and the outer-most row of contact pads 132 is wire-bonded to the third die 138b, as shown in FIG. 9.

A molding compound 143 is formed over the third die 138b and exposed portions of the second substrate 130, also shown in FIG. 9. The molding compound 143 comprises an insulating material that protects the wire bonds 142a and 142b, for example. The molding compound 143 comprises similar materials formed using similar methods described herein for molding compound 122 of the first packaged die 126. The molding compound 143 is also referred to herein as a second molding compound.

In some embodiments, the second dies 138a and 138b are packaged on the second substrate 130 using a flip-chip wafer level packaging (WLP) technique and wire-bonding process, for example. The second substrate 130 may comprise an LGA packaging device in some embodiments, to be described further herein with reference to FIGS. 18 through 20. Alternatively, the second dies 138a and 138b may be packaged on the second substrate 130 using other types of packaging processes.

After the molding compound 143 is applied, the second substrate 130 is then singulated from other second substrates 130 on a workpiece the second substrate 130 was fabricated on, forming a second packaged die 146, as shown in FIG. 10. The second packaged die 146 is also referred to herein as a top packaged die, for example. Final tests are then performed on the second packaged die 146. A plurality of metal stud bumps 144 is formed on the bottom surface of the second substrate 130, e.g., the metal stud bumps 144 are coupled to the contacts 136, also shown in FIG. 10. The top packaged die 146 includes the molding compound 143 at the top surface 149 thereof. The top packaged die 146 also includes the metal stud bumps 144 coupled to the contacts 136 proximate the bottom surface 148 thereof.

The metal stud bumps 144 are formed in perimeter regions 150 of the second substrate 130 of the second packaged die 146 in accordance with embodiments, as shown in FIG. 10. The second substrate 130 includes a perimeter region 150 where the metal stud bumps 144 are formed proximate edges of the second substrate 130. The perimeter region 150 is disposed about a central region 152 where no contacts 136 and no metal stud bumps 144 are formed, in an embodiment. The perimeter region 150 may comprise a plurality of contacts 136 formed therein in one or more rows. As an example, two rows of contacts 136 are shown in the perimeter region 150 in FIG. 10; alternatively, other numbers of rows may be used. The contacts 136 may be formed along all four edges, or two or more edges of the second substrate 130, in embodiments.

In one embodiment, the metal stud bumps 144 are coupled to each of the contacts 136 in the perimeter region 150, as shown in FIG. 10. One of the plurality of metal stud bumps 144 is bonded to each of the plurality of contacts 136 on the bottom packaged die 126. In other embodiments, one of the plurality of metal stud bumps 144 is bonded to only some of the plurality of contacts 136 on the bottom packaged die 126. For example, the metal stud bumps 144 are coupled to contacts 136 only in corner regions of the second substrate 130 in some embodiments. The metal stud bumps 144 may alternatively be coupled to contacts 136 in both corner regions and also in central edge regions of the second substrate 130 in other embodiments. At least 10% of the contacts 136 on the second substrate 130 in the perimeter region 150 have a metal stud bump 144 coupled thereto in some embodiments.

Figure 12:
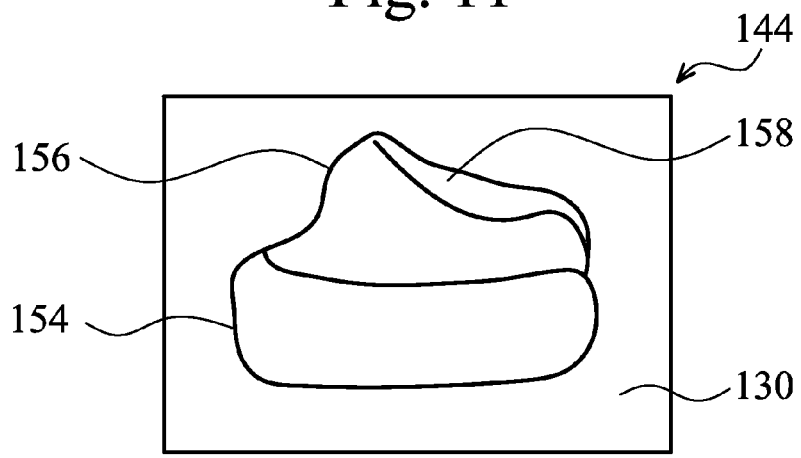
Figure 13:
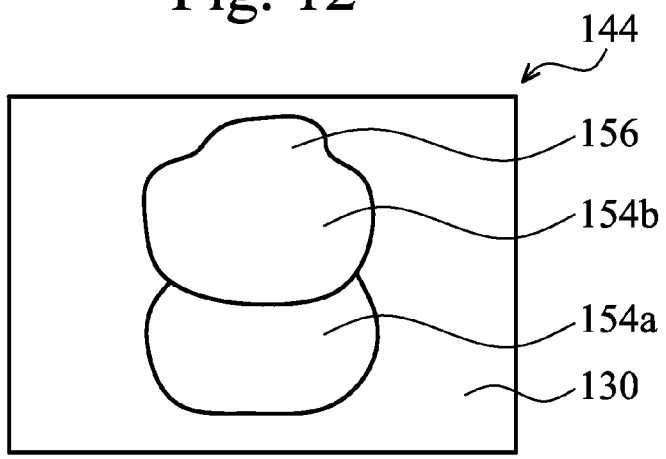

The plurality of metal stud bumps 144 may be attached using a method similar to a wire-bond method, e.g., using a wire bonder (not shown). The metal stud bumps 144 include a bump region 154 and a tail region 156 that is coupled to the bump region 154, as shown in the more detailed perspective views in FIGS. 11, 12 and 13, which illustrate several different shapes and dimensions of the metal stud bumps 144 in accordance with embodiments. The views shown in FIGS. 11, 12, and 13 are metal stud bumps 144 formed on an inverted second substrate 130 on a bottom surface 148 of a second packaged die 146.

Figure 11:
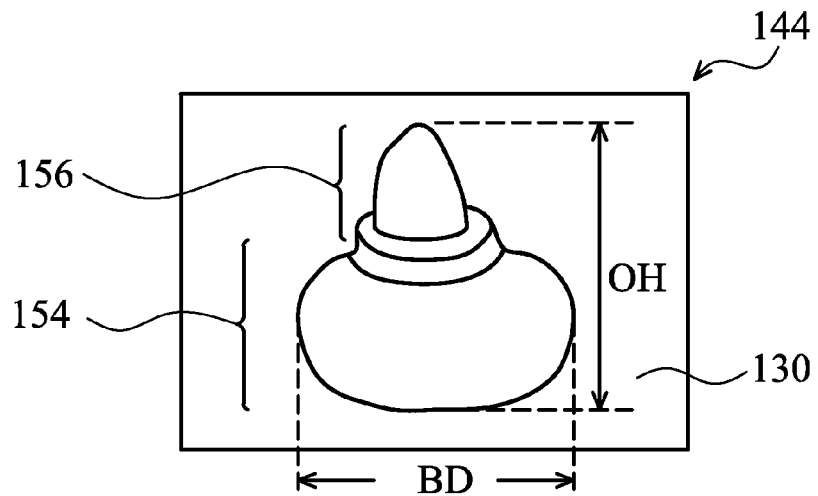
FIGS. 11 through 13 are perspective views of metal stud bumps that illustrate shapes and dimensions of portions of metal stud bumps formed on a top packaged die in accordance with embodiments.

Referring next to FIG. 11, the bump region 154 comprises a shape of a flattened ball, and the tail region 156 comprises a tail or stud shape. The plurality of metal stud bumps 144 comprises a conductive material, such as a metal. In some embodiments, the plurality of metal stud bumps 144 comprises Cu, Al, Au, Pt, Pd, and/or combinations thereof, for example. Alternatively, the metal stud bumps 144 may comprise other conductive materials and/or metals. Each of the plurality of metal stud bumps 144 comprises a height (i.e., overall height OH) of about 50 to 200 µm and a diameter (i.e., ball diameter BD) of about 50 to 150 µm proximate the second substrate 130, in some embodiments. In other embodiments, the ratio of overall height OH to bump diameter BD is greater than about 1.1 to 1.8, as another example. Alternatively, the metal stud bumps 144 may comprise other dimensions.

In some embodiments, the metal stud bumps 144 are formed using a method described in related U.S. patent application Ser. No. 13/483,734, filed on May 30, 2012, entitled, "Package on Package Devices and Methods of Packaging Semiconductor Dies," which application is hereby incorporated herein by reference. The metal stud bumps 144 are formed using a wire bonder that includes a capillary for dispensing a metal wire, an electric flame off (EFO) wand, and a transducer, not shown. The wire is inserted into the capillary, which is adapted to control and move the wire during the bonding process. The wire comprises Cu, Al, Au, Pt, Pd, and/or combinations thereof, for example. Alternatively, the wire may comprise other conductive materials and/or metals. The dimensions BD and OH vary according to the diameter of the wire, which may range from about 1 to 2 mm in some embodiments, for example.

An end of the wire protrudes from the tip of the capillary. The EFO wand is used to create an electrical spark proximate the end of the wire, which forms a ball at the end of the wire, e.g., using a free air ball (FAB) technique. The ball is placed against a contact 136 on the second substrate 130, and the capillary vibrates the ball in a horizontal direction in the view shown in FIG. 10, using ultrasonic vibration or power. A force is applied against the contact 136, and heat is applied to the second substrate 130, attaching the ball on the wire to the contact 136. The capillary is then removed, simultaneously breaking the wire and forming a tail region 156 having a predetermined length (refer again to FIG. 11), leaving a metal stud bump 144 attached or bonded to the second substrate 130 on top of the contact 136, as shown in the cross-sectional view of FIG. 10. Alternatively, the metal stud bumps 144 may be formed and bonded to the second substrate 130 using other methods.

In some embodiments, the metal stud bumps 144 comprise one bump region 154 and a tail region 156, as shown in FIG. 11. In other embodiments, the metal stud bumps 144 may comprise two bump regions 154a and 154b and a tail region 156, with one bump region 154b being disposed over the other bump region 154a, as shown in FIG. 13. The metal stud bumps 144 may comprise a first bump region 154a, a second bump region 154b proximate the first bump region 154a. In some embodiments, the tail region 156 comprises a downwardly smoothed region 158 proximate a top surface thereof, as shown in FIG. 12. The metal stud bumps 144 may be formed using a standard stud bump process; a gold, copper, or other metal accubump process; a stacked accubump process; a downward smoothed accubump process; or other metal stud bump forming processes, as examples.

Figure 14:
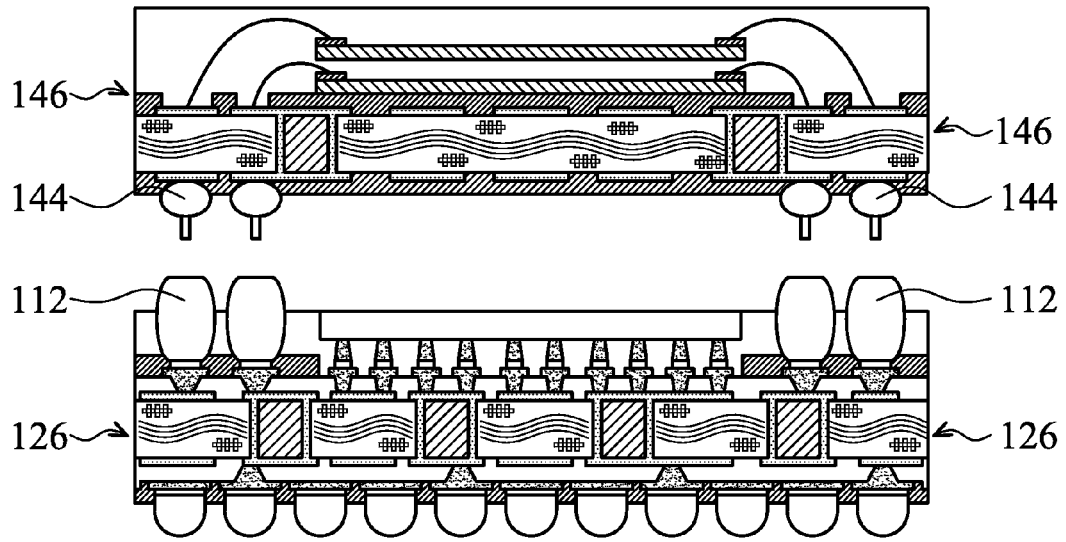
FIG. 14 illustrates a cross-sectional view of attaching a top packaged die to a bottom packaged die in accordance with an embodiment.

FIG. 14 illustrates a cross-sectional view of attaching the second packaged die 146 to a first packaged die 126 in accordance with an embodiment. The second packaged die 146 is lowered until the metal stud bumps 144 are coupled to the solder balls 112. The solder balls 112 are reflowed so that a solder joint 162 is formed over each of the metal stud bumps 144, as shown in FIG. 15, which is a cross-sectional view of a PoP device 160 packaged in accordance with methods described herein. The solder joints 162 have a substantially barrel shape in the cross-sectional view and have a low profile of solder, i.e., the solder bump 112 material disposed around the metal stud bump 144 structure. Each of the plurality of metal stud bumps 144 is embedded in a solder joint 162. The plurality of metal stud bumps 144 is disposed between the first packaged die 126 and the second packaged die 146, as shown. The solder joints 162 electrically couple together the bond pads 102 of the first packaged die 126 and the contacts 136 of the second packaged die 146, and also mechanically couple together the first and second packaged dies 126 and 146.

The solder joints 162 are formed in some embodiments by heating the first substrate 100 and the second substrate 130 to reflow a solder material of the plurality of solder balls 112 on the top surface 129 of the first packaged die 126 and form the plurality of solder joints 162 between the first substrate 100 and the second substrate 130. At least some of the plurality of solder joints 162 include one of the plurality of metal stud bumps 144. One illustrative process might include heating the second substrate 130 with the metal stud bumps 144 formed thereon (on a top packaged die 146) to above the solder melting point, which is about +10° C.; aligning a solder ball 112 (on a bottom packaged die 126); and placing it on the metal stud bump 144 to form a temporary joint, and following with a process to form a permanent solder joint 162, for example.

Each of the plurality of metal stud bumps 144 (which become part of the solder joint 162 after the solder reflow process) on the top packaged die 146 is coupled to a contact 136 on a bottom surface of the top packaged die 146, and each of the plurality of metal stud bumps 144 extends partially to a bond pad 102 on the bottom packaged die 126 within the solder joints 162. The metal stud bumps 144 do not extend fully to the bond pads 102 of the bottom packaged die 126 in the embodiment shown in FIG. 15. Alternatively, the metal stud bumps 144 may extend fully to the bond pads 102 of the bottom packaged die 126, not shown.

In some embodiments, an optional no-flow underfill (NUF) material 163 may be formed or disposed on the solder balls 112 on the bottom packaged die 126 before attaching the top packaged die 146 to the bottom packaged die 126. For example, FIG. 16 illustrates an embodiment wherein the solder balls 112 are dipped in the no-flow underfill material 163. The no-flow underfill material 163 may comprise an epoxy, a polymer, flux, and/or solder paste, as examples. The no-flow underfill material 163 is disposed proximate the solder joints 162 after the solder reflow process. In another embodiment, the no-flow underfill material 163 is printed over the plurality of solder balls 112 or is coated over the plurality of solder balls 112 using a deposition, spray or other process, as shown in FIG. 17. The no-flow underfill material 163 may also comprise other materials and may be formed on the solder balls 112 using other methods. The NUF material 163 improves the joining of the solder balls 112 to the metal stud bumps 144 in some embodiments, for example.

The optional no-flow underfill material 163 partially or fully fills a gap between the first packaged die 126 and the second packaged die 146 and strengthens the connection between the first packaged die 126 and the second packaged die 146. The no-flow underfill material 163 also maintains an alignment of the metal stud bumps 144 to the solder balls 112 before, during, and after the solder reflow process to form the solder joints 162 that include the novel embedded metal stud bumps 144. The NUF 163 functions as a flux, improving the formation of the solder joints 162. The NUF 163 also functions as an underfill material that is left remaining around the solder joints 162 after a solder reflow process, protecting the solder joints 162.

In some embodiments, the NUF 163 may be dipped on the exposed solder joints 162 that include the metal stud bumps 144, followed by a solder reflow process to form a solder joint 162 with improved reliability, for example.

After the second packaged die 146 is coupled to the first packaged die 126, the PoP device 160 is tested using a final test process, in some embodiments.

Figure 18:
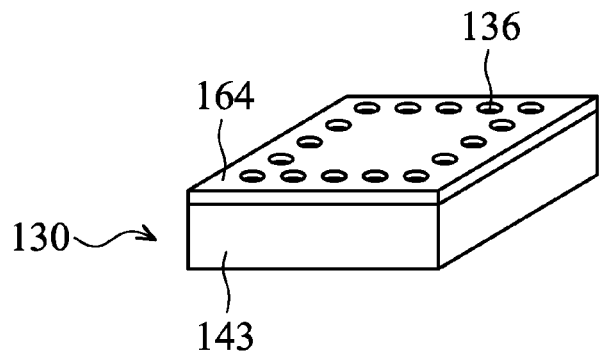
FIG. 18 is a perspective view of a land grid array (LGA) packaging device that is used to package at least one second die in a top package in accordance with an embodiment.
Figure 19:
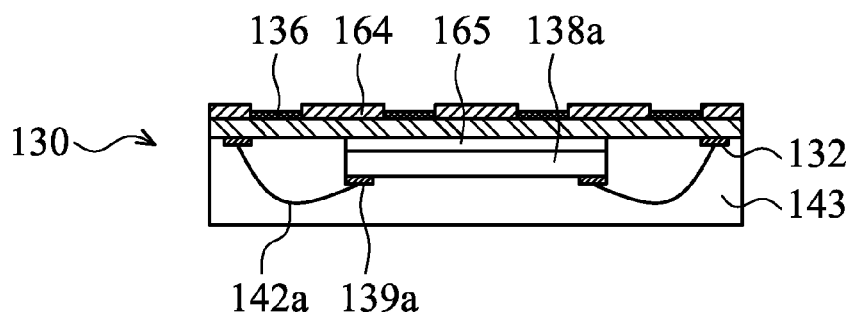
FIG. 19 is a cross-sectional view of the LGA packaging device shown in FIG. 18.

FIG. 18 shows a perspective view of a second substrate 130 comprising an LGA packaging device in accordance with an embodiment. A bottom view of the second substrate 130 is shown having a printed circuit board (PCB) substrate material 164 disposed over the molding compound 143. The contacts 136 are exposed through the PCB substrate material 164. FIG. 19 shows a cross-sectional view of the second substrate 130. Only one second die 138a is included in the second packaged die 146 in the embodiment shown. The second die 138a may be attached to the PCB substrate material 164 using an adhesive tape 165, for example. The LGA packaging device is a chip scale package in the fine ball array (FBGA) family, which has thin contacts yet does not include solder balls, thus providing a smaller size and thickness than conventional packaging devices. The body of the LGA packaging device may be square or rectangular, and the contacts 136 may be disposed on a narrow pitch of less than about 0.8 mm.

Figure 20:
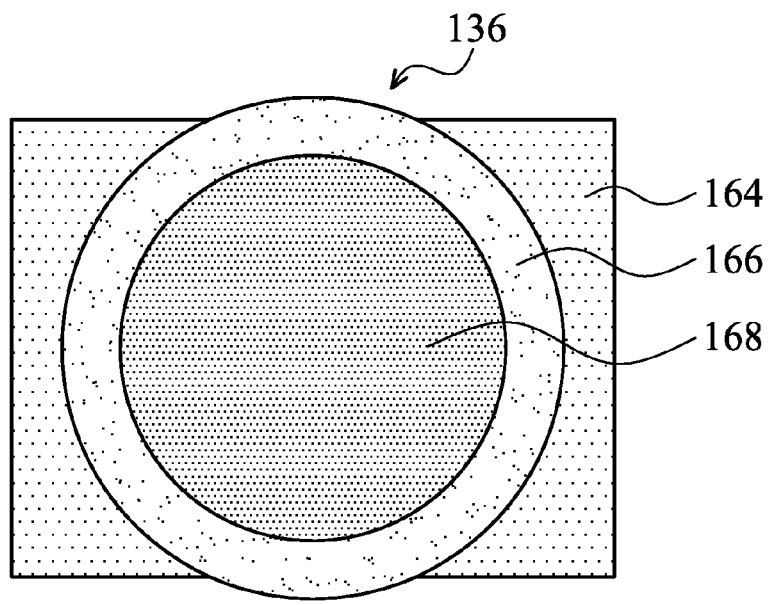
FIG. 20 is a top view of a contact disposed on a bottom surface of the LGA packaging device shown in FIGS. 18 and 19.

FIG. 20 shows a more detailed bottom view of a contact 136 on the second substrate 130 shown in FIGS. 18 and 19. The contact 136 comprises a landing pad exposed through the PCB substrate material 164 that includes a first metal 166 and a second metal 168 disposed over the first metal 166. The first metal 166 comprises Ni and the second metal 168 comprises Au that is plated over the first metal 166 in an embodiment. These metals 166 and 168 provide an excellent surface for forming the metal stud bumps 144 of embodiments of the disclosure to the contacts 136, for example. Alternatively, the first and second metals 166 and 168 may comprise other materials. Advantageously, the metal stud bumps 144 may comprise a same plated metal finish as the contact 136 in some embodiments. In some embodiments, only the second metal 168 is visible in a bottom view of the contact 136 on the second substrate 130, for example, not shown.

Figure 21:
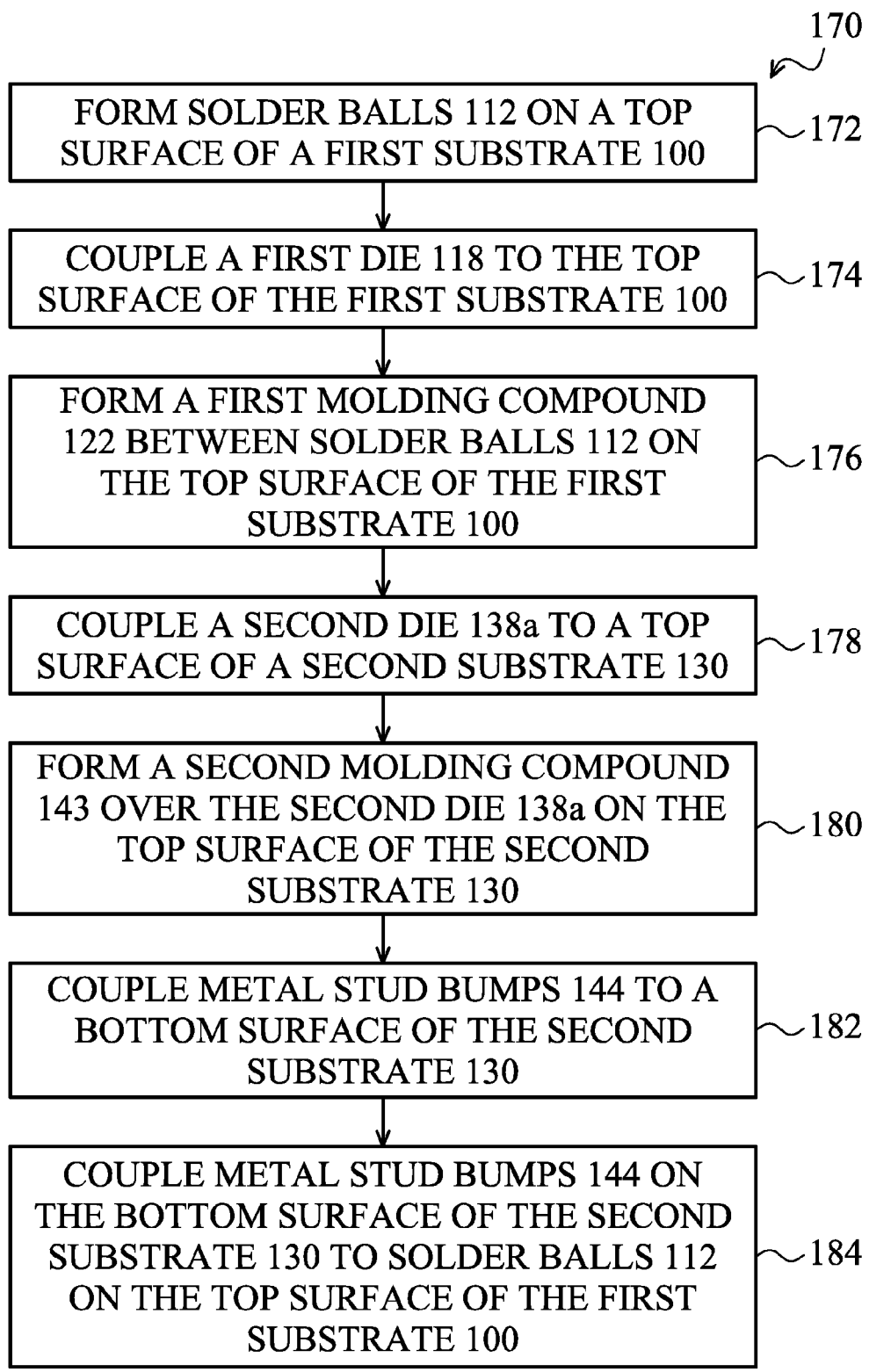
FIG. 21 is a flow chart illustrating a method of packaging semiconductor dies in accordance with an embodiment of the present disclosure.

FIG. 21 is a flow chart 170 illustrating a method of packaging semiconductor devices (i.e., first dies 118, second dies 138a, and optionally also third dies 138b) together in a PoP device 160 in accordance with an embodiment of the present disclosure. In step 172, solder balls 112 are formed on a top surface of a first substrate 100. In step 174, a first die 118 is coupled to a top surface of the first substrate 100. In step 176, a first molding compound 122 is formed between solder balls 112 on the top surface of the first substrate 100. In step 178, a second die 138a is coupled to a top surface of a second substrate 130. In step 180, a second molding compound 143 is formed over the second die 138a (and also over the third die 138b, if included) on the top surface of the second substrate 130. In step 182, a plurality of metal stud bumps 144 is coupled to a bottom surface of the second substrate 130. In step 184, each of the metal stud bumps 112 on the bottom surface of the second substrate 130 is coupled to one of the solder balls 112 on the top surface of the first substrate 100.

In some embodiments, the second dies 138a and 138b comprise memory devices such as random access memories (RAM) or other types of memory devices, and the first die 118 comprises a logic device. Alternatively, the second dies 138a and 138b and the first die 118 may comprise other functional circuitry. A different method may be used to attach the second dies 138a and 138b to the second substrate 130 than is used to attach the first die 118 to the first substrate 100, as shown in the drawings. Alternatively, the same method may be used to attach the first die 118 to the first substrate 100 that is used to attach the second dies 138a and 138b to the second substrate 130.

In some embodiments, the second dies 138a and 138b are packaged using a flip-chip WLP technique and wire-bonding, an LGA packaging device, or other type of second substrate 130, and the first die 118 is packaged using a flip-chip and BOT technique, as an example. Alternatively, the second dies 138a and 138b and the first die 118 may be packaged using other methods or techniques.

Embodiments of the present disclosure include methods of packaging multiple semiconductor devices (e.g., first dies 118, second dies 138a, and optionally also third dies 138b) in a single PoP device 160 using metal stud bumps 144 in the electrical connections (e.g., the solder joints 162) between the first packaged dies 126 and the second packaged dies 146. Embodiments of the present disclosure also include PoP devices 160 that include the novel metal stud bumps 144 described herein.

Advantages of embodiments of the disclosure include providing novel metal stud bumps 144 that reduce the distance between first and second packaged dies 126 and 146 in PoP devices 160, and thus also reduce the overall thickness of the PoP devices 160 that include the metal stud bumps 144, resulting in reduced total PoP joint height. The metal stud bump 144 overall height OH and width (bump diameter BD) is very small, thus reducing the amount of solder that is required to be used for the solder balls 112. The small overall height OH of the metal stud bumps 144 forms a low profile of solder around the metal stud bumps 144 after the solder reflow process of the solder balls 112, reducing a standoff height or distance between the first and second packaged dies 126 and 146, thus also reducing the PoP device 160 thickness. PoP device 160 thicknesses of about 1 mm or less are achievable using the novel embodiments described herein, for example. Alternatively, the PoP device 160 thicknesses may comprise other dimensions. PoP device 160 thicknesses may be decreased by about 10 mm or greater (or 10% or greater) by the use of embodiments of the present disclosure, for example. In some applications, the PoP device 160 standoff height may be reduced by about 40% or greater, e.g., from about 280 μm to about 150 μm, as another example. The innovative structures described herein advantageously produce ultra-thin stacked packages and packaging techniques for semiconductor devices.

Furthermore, because the bump diameter BD of the bump portion 154 of the metal stud bumps 144 is very small, the pitch of the contacts 136 on the bottom surface of the top packaged die 146 and the pitch of the bond pads 102 on the top surface of the bottom packaged die 126 may be reduced, resulting in a smaller width in a top view for the packaged dies 126 and 146 and also the PoP device 160. PoP devices 160 having a body size with a width of about 14 mm×14 mm or less in a top view are achievable using embodiments of the present disclosure, for example.

The metal stud bumps 144 described herein may be produced with low costs, providing a cost savings in the packaging process. The presence of the metal stud bumps 144 in the solder joints 162 facilitate in the prevention of bridging of adjacent solder joints 162 in some embodiments, reducing or preventing shorts and improving device yields. Better warpage control and package thickness control of the PoP devices 160 is achieved by the use of the novel methods of embodiments of the disclosure.

The novel PoP structures and designs described herein are easily implementable in semiconductor device packaging process flows. Embodiments of the present disclosure are particularly advantageous for use in end applications that require low profile packages, such as handheld products, for example.

In embodiments wherein one of the plurality of metal stud bumps 144 is bonded to only some of the plurality of contacts 136 on the top packaged die 146, the other contacts 136 not having a metal stud bump 144 coupled thereto are bonded to bond pads 102 on the bottom packaged die 126 using solder balls 112. The solder joints 162 for these contacts 136 that do not include a metal stud bump 144 bonded thereto comprise only solder. Advantageously, the metal stud bumps 144 are either placed in the entire perimeter of the PoP device 160, in corner regions, in both corner and central edge regions, so that the PoP device 160 is more robust. The metal stud bumps 144 also provide consistent spacing between the packaged dies 126 and 146 across the surfaces of the packaged dies 126 and 146, e.g., in a vertical direction in the cross-sectional views shown in FIGS. 15, 16, and 17.

Chips such as process, analog, radio-frequency (RF), memory chips, and other types of devices may be packaged utilizing embodiments of the present disclosure to achieve low cost, thin and small size, and high speed benefit packaging. The innovative processes enhance yield of the metal stud bump 144 and solder ball 112 joint assembly.

In accordance with one embodiment of the present disclosure, a PoP device includes a bottom packaged die comprising a plurality of solder balls disposed on a top surface thereof, and a top packaged die comprising a plurality of metal stud bumps disposed on a bottom surface thereof. The plurality of metal stud bumps includes a bump region and a tail region coupled to the bump region. Each of the plurality of metal stud bumps on the top packaged die is coupled to one of the plurality of solder balls on the bottom packaged die.

In accordance with another embodiment, a PoP device includes a bottom packaged die comprising a plurality of first solder balls disposed on a top surface thereof and a plurality of second solder balls disposed on bottom surface thereof. The bottom packaged die includes a molding compound formed over a top surface thereof between the plurality of first solder balls. The PoP device also includes a top packaged die comprising a plurality of metal stud bumps disposed on a bottom surface thereof. The plurality of metal stud bumps includes a bump region and a tail region coupled to the bump region. Each of the plurality of metal stud bumps on the top packaged die is coupled to one of the plurality of first solder balls on the top surface of the bottom packaged die.

In accordance with yet another embodiment, a method of packaging semiconductor dies includes forming a plurality of solder balls on a top surface of a first substrate and coupling a first die to the top surface of the first substrate. A first molding compound is formed between the plurality of solder balls on the top surface of the first substrate. The method includes coupling a second die to a top surface of a second substrate, and forming a second molding compound over the second die on the top surface of the second substrate. A plurality of metal stud bumps is coupled to a bottom surface of the second substrate. The plurality of metal stud bumps includes a bump region and a tail region coupled to the bump region. Each of the plurality of metal stud bumps on the bottom surface of the second substrate is coupled to one of the plurality of solder balls on the top surface of the first substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package-on-package (PoP) device, comprising:
   a bottom packaged die comprising a plurality of solder balls disposed on a top surface thereof; and
   a top packaged die comprising a plurality of metal stud bumps disposed on a bottom surface thereof, wherein each of the plurality of metal stud bumps comprises a bump region and a tail region coupled to the bump region, and wherein each of the plurality of metal stud bumps on the top packaged die is coupled to and penetrates a respective one of the plurality of solder balls on the bottom packaged die, and each of the plurality of metal stud bumps further comprises the bump region being a first bump region, a second bump region stacked upon the first bump region with an interface between the first bump region and the second bump region.

2. The device according to claim 1, wherein the bottom packaged die comprises a first die coupled to a first substrate, and wherein the top packaged die comprises a second die coupled to a second substrate.

3. The device according to claim 2, wherein the top packaged die comprises a plurality of second dies stacked vertically above the second substrate.

4. The device according to claim 2, wherein the second substrate comprises a land grid array (LGA) packaging device.

5. A package-on-package (PoP) device, comprising:
   a bottom packaged die comprising a plurality of first solder balls disposed on a top surface thereof and a plurality of second solder balls disposed on a bottom surface thereof, wherein the bottom packaged die includes a molding compound formed over the top surface thereof between the plurality of first solder balls; and
   a top packaged die comprising a plurality of metal stud bumps disposed on a bottom surface thereof, wherein each of the plurality of metal stud bumps comprises a bump region and a tail region coupled to the bump region, and wherein each of the plurality of metal stud bumps on the top packaged die is coupled to and penetrates a respective one of the plurality of first solder balls on the top surface of the bottom packaged die, and each of the plurality of metal stud bumps further comprises the bump region being a first bump region, a second bump region stacked upon the first bump region with an interface between the first bump region and the second bump region.

6. The device according to claim 5, wherein each of the plurality of first solder balls on the bottom packaged die is coupled to a bond pad on a top surface of the bottom packaged die, and wherein each of the plurality of metal stud bumps extends at least partially to a bond pad on the bottom packaged die.

7. The device according to claim 5, wherein the top packaged die comprises a plurality of contacts on the bottom surface thereof, and wherein each of the plurality of metal stud bumps is coupled to one of the plurality of contacts on the bottom surface of the top packaged die.

8. The device according to claim 7, wherein one of the plurality of metal stud bumps is bonded to each of the plurality of contacts on the top packaged die.

9. The device according to claim 7, wherein one of the plurality of metal stud bumps is bonded to some of the plurality of contacts on the top packaged die.

10. The device according to claim 7, wherein the plurality of contacts comprises a first metal and a second metal plated on the first metal.

11. The device according to claim 10, wherein the first metal comprises Ni, and wherein the second metal comprises Au.

12. The device according to claim 5, wherein the plurality of metal stud bumps comprises a material selected from the group consisting essentially of Cu, Al, Au, Pt, Pd, and combinations thereof.

13. A method of packaging semiconductor dies, the method comprising:
    forming a plurality of solder balls on a top surface of a first substrate;
    coupling a first die to the top surface of the first substrate;
    forming a first molding compound between the plurality of solder balls on the top surface of the first substrate;
    coupling a second die to a top surface of a second substrate;
    forming a second molding compound over the second die on the top surface of the second substrate;
    coupling a plurality of metal stud bumps to a bottom surface of the second substrate, each of the plurality of metal stud bumps comprising a bump region and a tail region coupled to the bump region and each of the plurality of metal stud bumps further comprises a first bump region, a second bump region stacked upon the first bump region with an interface between the first bump region and the second bump region and
    embedding each of the plurality of metal stud bumps on the bottom surface of the second substrate within a respective one of the plurality of solder balls on the top surface of the first substrate by penetrating the respective one of the plurality of solder balls with the tail region of the respective metal stud bump.

14. The method according to claim 13, further comprising disposing a no-flow underfill (NUF) material over the plurality of solder balls.

15. The method according to claim 14, wherein disposing the NUF material over the plurality of solder balls comprises dipping the plurality of metal stud bumps in the NUF material, printing the NUF material over the plurality of solder balls, or coating the NUF material over the plurality of solder balls.

16. The method according to claim 13, wherein forming the first molding compound comprises forming the first molding compound over the first die and the plurality of solder balls on the top surface of the first substrate, and removing a portion of the first molding compound to expose a top surface of the first die and a top surface of the plurality of solder balls, using a molded underfill (MUF) process.

17. The method according to claim 13, wherein coupling the second die to the top surface of the second substrate comprises wire-bonding contacts on a top surface of the second die to contact pads on the top surface of the second substrate, wherein the method further comprises coupling a third die over the second die and wire-bonding contacts on a top surface of the third die to the contact pads on the top surface of the second substrate, and wherein forming the second molding compound further comprises forming the second molding compound over the third die.

18. The method according to claim 13, further comprising heating the first substrate and the second substrate to reflow a solder material of the plurality of solder balls on the top surface of the first substrate and form a plurality of solder joints between the first substrate and the second substrate, at least some of the plurality of solder joints including one of the plurality of metal stud bumps.

* * * * *